US010051224B2

(12) United States Patent
Eshel et al.

(10) Patent No.: US 10,051,224 B2
(45) Date of Patent: *Aug. 14, 2018

(54) DUAL SAMPLE-AND-HOLD CIRCUIT WITH RESISTIVE GAIN

(71) Applicant: Sony Semiconductor Solutions Corporation, Kanagawa (JP)

(72) Inventors: Noam Eshel, Pardesia (IL); Golan Zeituni, Kfar-Saba (IL)

(73) Assignee: Sony Semiconductor Solutions Corporation, Kanagawa (JP)

( * ) Notice: Subject to any disclaimer, the term of this patent is extended or adjusted under 35 U.S.C. 154(b) by 7 days.

This patent is subject to a terminal disclaimer.

(21) Appl. No.: 15/356,500

(22) Filed: Nov. 18, 2016

(65) Prior Publication Data

US 2017/0085821 A1    Mar. 23, 2017

Related U.S. Application Data

(63) Continuation of application No. 14/857,746, filed on Sep. 17, 2015, now Pat. No. 9,525,837.

(51) Int. Cl.
| | |
|---|---|
| *H04N 5/378* | (2011.01) |
| *H04N 5/374* | (2011.01) |
| *H03M 3/00* | (2006.01) |
| *H02M 11/00* | (2006.01) |
| *G11C 27/02* | (2006.01) |

(52) U.S. Cl.
CPC .......... *H04N 5/378* (2013.01); *G11C 27/024* (2013.01); *H02M 11/00* (2013.01); *H03M 3/30* (2013.01); *H04N 5/374* (2013.01)

(58) Field of Classification Search
CPC ....... H04N 5/357; H04N 5/3575; H04N 5/378
See application file for complete search history.

(56) References Cited

U.S. PATENT DOCUMENTS

| | | | |
|---|---|---|---|
| 7,034,275 B2 | 4/2006 | Mizuno | |
| 8,081,243 B2 | 12/2011 | Chou | |
| 8,853,608 B2 | 10/2014 | Cho | |
| 9,525,837 B1* | 12/2016 | Eshel | ..................... H04N 5/378 |
| 9,661,251 B1* | 5/2017 | Eshel | ................... H04N 5/3575 |
| 9,826,180 B2* | 11/2017 | Eshel | ................... H04N 5/3598 |
| 2009/0295970 A1 | 12/2009 | Fukuoka | |
| 2009/0321799 A1 | 12/2009 | Velichko et al. | |

OTHER PUBLICATIONS

International Search Report (PCT/ISA/210) dated Nov. 11, 2016 for corresponding International Application No. PCT/IB2016/055089.
Written Opinion of the International Searching Authority (PCT/ISA/237) dated Nov. 11, 2016 for corresponding International Application No. PCT/IB2016/055089.

* cited by examiner

*Primary Examiner* — Nelson D. Hernández Hernández
(74) *Attorney, Agent, or Firm* — Michael Best & Friedrich LLP

(57) ABSTRACT

An image processing circuit includes a first dual sample-and-hold circuit that samples a first data and a second data from a first pixel, a second dual sample-and-hold circuit that samples a third data and a fourth data from a second pixel, a voltage-to-current circuit including a resistor and a current source, that receives the first data and the second data to output a first difference data, and that receives the third data and the fourth data to output a second difference data; and an analog-to-digital converter that converts the first and second difference data from an analog form to a digital form.

21 Claims, 5 Drawing Sheets

DUAL SAMPLE-AND-HOLD CIRCUIT WITH RESISTIVE GAIN

CROSS REFERENCE TO RELATED APPLICATIONS

This application is a Continuation of application Ser. No. 14/857,746, filed Sep. 17, 2015, the entire contents of which are incorporated herein by reference.

BACKGROUND OF THE INVENTION

1. Field of the Invention

This application relates generally to sample-and-hold circuits. More specifically, this application relates to a sample-and-hold circuit with increased throughput in an image sensor or other electronic devices.

2. Description of Related Art

Image sensing devices typically consist of an image sensor, generally an array of pixel circuits, as well as signal processing circuitry and any associated control or timing circuitry. Within the image sensor itself, charge is collected in a photoelectric conversion device of the pixel circuit as a result of the impingement of light.

One example of a pixel circuit is illustrated in FIG. 1. As shown in FIG. 1, a pixel circuit 100 includes a photoelectric conversion device 101 (for example, a photodiode), a floating diffusion FD, a transfer transistor 102, a reset transistor 103, an amplification transistor 104, and a selection transistor 105, and a vertical signal line 106. As illustrated, vertical signal line 106 is common to a plurality of pixel circuits within the same column. Alternatively, a vertical signal line may be shared among multiple columns. Gate electrodes of transfer transistor 102, reset transistor 103, and selection transistor 105 receive signals TRG, RST, and SEL, respectively. These signals may, for example, be provided by the control or timing circuitry.

While FIG. 1 illustrates a pixel circuit having four transistors in a particular configuration, the current disclosure is not so limited and may apply to a pixel circuit having fewer or more transistors as well as other elements, such as capacitors, resistors, and the like. Additionally, the current disclosure may be extended to configurations where one or more transistors are shared among multiple photoelectric conversion devices.

The accumulated charge is then converted to a digital value. Such a conversion typically requires several circuit components such as sample-and-hold (S/H) circuits, analog-to-digital converters (ADC), and timing and control circuits, with each circuit component serving a purpose in the conversion. For example, the purpose of the S/H circuit may be to sample the analog signals from different time phases of the photo diode operation, after which the analog signals may be converted to digital form by the ADC.

As modern imaging applications require image capturing systems to work at increasingly higher speed, additional needs become apparent. For example, in order to smoothly capture high speed scenes such as sports motion, or to play back captured data in smooth slow motion, it is necessary to operate the image sensor at a very high frame rate. Practical circuit limitations such as circuit settling time, charge propagation time, and the like hinder how fast circuit elements can operate.

Accordingly, there is a need for circuit designs that are capable of operating at a very high speed.

BRIEF SUMMARY OF THE INVENTION

Various aspects of the present disclosure relate to processing pixels of an image sensor with high accuracy and high throughput.

In one example, an image processing circuit comprises a first sample-and-hold circuit configured to sample a first data from a pixel; a second sample-and-hold circuit configured to sample a second data from the pixel; a voltage-to-current circuit including a resistor and a current source, and configured to receive the first data and the second data and output a difference data; and a current-mode analog-to-digital converter configured to convert the difference data from an analog form to a digital form.

In another example, an image processing circuit comprises a first dual sample-and-hold circuit configured to sample a first data and a second data from a first pixel; a second dual sample-and-hold circuit configured to sample a third data and a fourth data from a second pixel; a voltage-to-current circuit including a resistor and a current source, and configured to receive the first data and the second data and output a first difference data, and to receive the third data and the fourth data and output a second difference data; and an analog-to-digital converter configured to convert the first and second difference data from an analog form to a digital form.

The above examples may be part of an imaging device along with a pixel array.

In this manner, various aspects of the present disclosure provide for improvements in the technical fields of imaging and image processing.

This disclosure can be embodied in various forms, including hardware-implemented methods, signal processing circuits, image sensor circuits, application specific integrated circuits, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth, such as circuit configurations, waveform timings, circuit operations, and the like, in order to provide an understanding of one or more embodiments of the present invention. It will be readily apparent to one skilled in the art that these specific details are merely exemplary and not intended to limit the scope of this application.

Moreover, while the present disclosure focuses mainly on examples in which the S/H circuits are used in image sensors, it will be understood that this is merely one example of an implementation. It will further be understood that the disclosed S/H circuits can be used in any device in which there is a need to sample a signal and/or compare two voltages; for example, an audio signal processing circuit, industrial measurement and control circuit, and so on.

Thus, the present disclosure may be used to accomplish correlated double sampling (CDS). CDS is capable of overcoming a number of pixel noise related issues by sampling each pixel in, for example, an image sensor twice. First, the reset voltage $V_{reset}$ of a pixel is sampled; subsequently, the voltage of a pixel after it has been exposed to light $V_{data}$ is sampled. The reset value $V_{reset}$ is then subtracted from the light exposed value $V_{data}$ to provide a value which reflects the amount of light falling on the pixel.

In an image sensor implementation, many copies of S/H circuits and ADCs may be included so that parallel operation can be achieved for the purpose of increasing speed of the sensor. One architecture for this implementation is a column parallel architecture where individual S/H circuits and ADC circuits are provided for each column (or group of columns), so that one entire row of pixels can be processed in parallel. For example, a S/H pair, which includes two individual S/H circuits, can be used in each column. In such a dual S/H circuit, one S/H circuit may be used to sample the reset signal and the other S/H circuit may be used to sample the light exposed signal, thus increasing throughput.

[Dual Sample-and-Hold Configuration]

Figure 1:
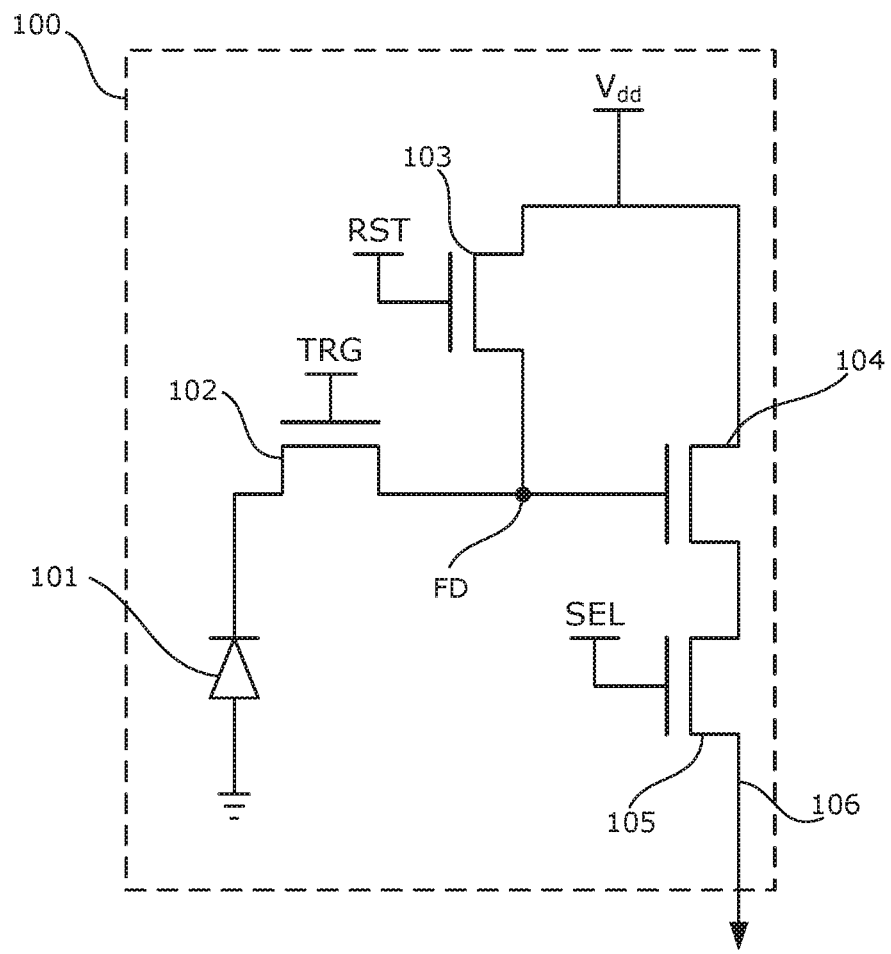
FIG. 1 illustrates an exemplary pixel circuit for use with various aspects of the present disclosure.
Figure 2:
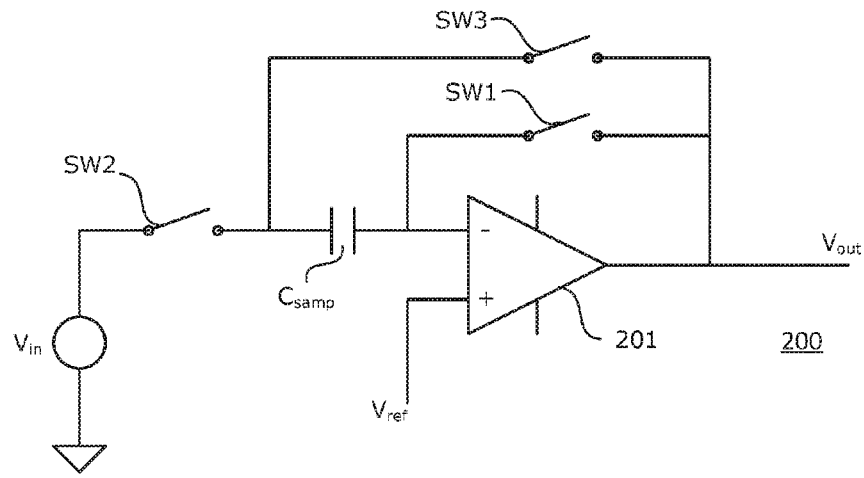
FIG. 2 illustrates an exemplary bottom plate sampling S/H circuit according to various aspects of the present disclosure.

FIG. 2 illustrates an exemplary analog S/H circuit 200, of a bottom plate sampling type. This illustrative S/H circuit comprises an amplifier 201, a sampling capacitor $C_{samp}$, and switches SW1, SW2, and SW3. In this example, $V_{ref}$ is a reference voltage and $V_1$ is the input analog voltage (that is, the input signal) to be sampled. In an image sensor implementation, $V_1$ represents a pixel value. Switches SW1, SW2, and SW3 are preferably transistors, such as CMOS transistors.

Figure 3:
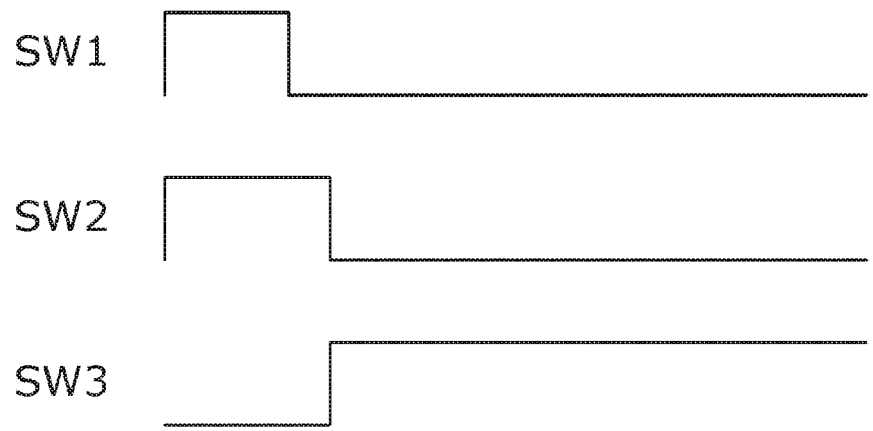
FIG. 3 illustrates an exemplary signal timing diagram of the exemplary S/H circuit according to FIG. 2.

In operation, switches SW1-SW3 are controlled according to a particular timing. FIG. 3 illustrates an exemplary timing diagram for the operation of S/H circuit 200. In FIG. 3, for purposes of illustration, "high" signals indicate "closed" switches and "low" signals indicate "open" switches.

At the beginning of the illustrated period, the signal $V_{in}$ is sampled. That is, switches SW1 and SW2 are closed, whereas switch SW3 is open. This causes capacitor $C_{samp}$ to be charged to the voltage $V_{in}-V_{ref}$. After $C_{samp}$ has been charged, switch SW1 is opened, while switch SW2 remains closed and switch SW3 remains open. This completes the sampling. Then, switches SW2 and SW3 are reversed. That is, while SW1 remains open, switch SW2 becomes open and switch SW3 becomes closed. This causes the sampled signal to appear as the output voltage $V_{out}$.

Figure 4:
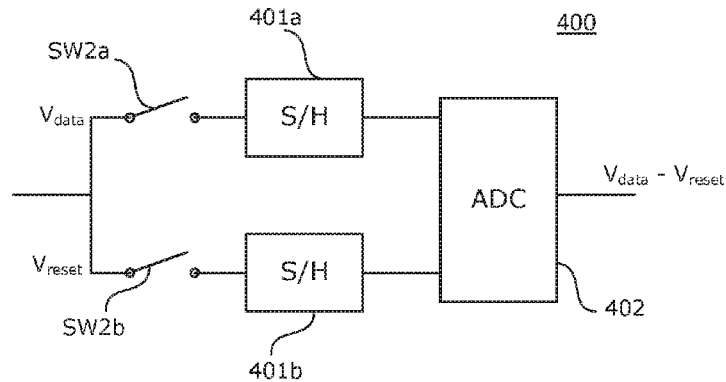
FIG. 4 illustrates an exemplary dual S/H circuit according to various aspects of the present disclosure.

To achieve sufficiently high throughput while performing CDS, the above S/H circuits may be combined in a dual S/H configuration. FIG. 4 is a block diagram of one such configuration. FIG. 4 illustrates an exemplary circuit 400 that converts the reset and light exposed signals from a pixel into a digital form representative of $V_{data}-V_{reset}$. Exemplary circuit 400 may be, for example, the readout circuit of an image sensor pixel. Circuit 400 includes a first data path including a switch SW2a and a S/H circuit 401a, and a second data path including a switch SW2b and a S/H circuit 401b. Preferably, each data path corresponds to the exemplary S/H circuit 200 described above with regard to FIGS. 2-3. That is, switches SW2a/b preferably respectively correspond to switch SW2 of FIG. 2, and S/H circuits 401a/b preferably respectively correspond to the remainder of S/H circuit 200 of FIG. 2. As illustrated in FIG. 4, the first data path corresponds to light exposed signal $V_{data}$ and the second data path corresponds to reset signal $V_{reset}$. The outputs of S/H circuits 401a/b are operatively connected to ADC 402, which in turn outputs the digital representation of $V_{data}-V_{reset}$.

To accomplish this, switches SW2a and SW2b are controlled at an appropriate timing so that S/H circuits 401a/b successively sample the input signal at the proper time so that $V_{data}$ and $V_{reset}$ appear at the top and bottom S/H circuits, respectively. ADC 402 converts the two voltages into digital values. Additionally, a subtraction is performed so that the appropriate output signal is obtained. This subtraction may be performed in the analog domain before analog-to-digital conversion, or may be performed in the digital domain after each signal has been individually converted to digital form.

Figure 5:
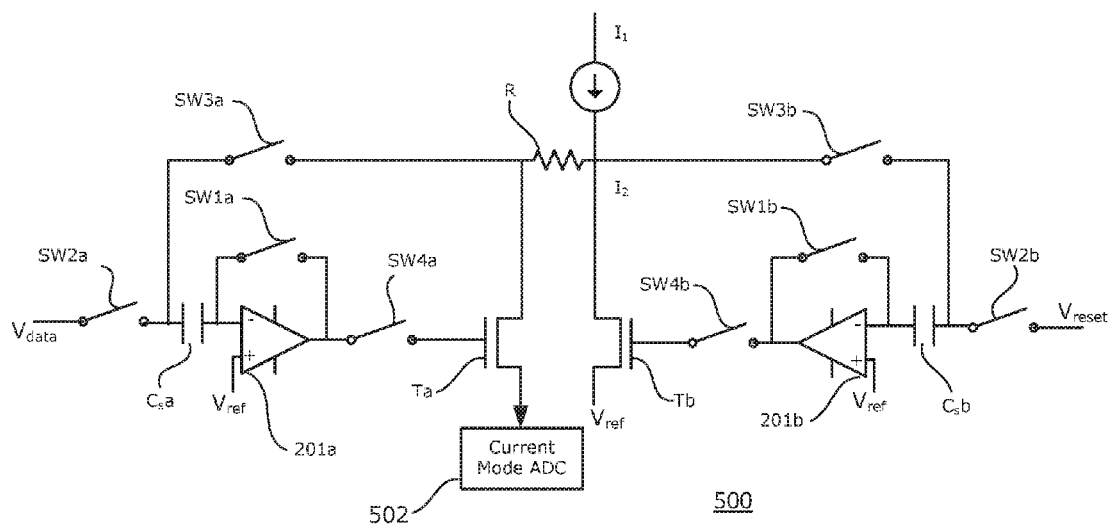
FIG. 5 illustrates an exemplary dual S/H circuit according to various aspects of the present disclosure.

FIG. 5 provides a detailed illustration of an exemplary dual S/H circuit 500. As illustrated, dual S/H circuit 500 includes a left S/H circuit that samples $V_{data}$ from a pixel and a right S/H circuit that samples $V_{reset}$ from the pixel. Both S/H circuits respectively include switches SW1a/b, SW2a/b, SW3a/b, SW4a/b, differential amplifier 201a/b, sampling capacitors $C_s$a/b. In this manner, the two S/H inputs sample the output from the same pixel but at different timing phases to achieve CDS. Dual S/H circuit 500 also includes a resistor R, transistors Ta and Tb, a current source $I_1$, and a current-mode ADC 502.

To sample the reset signal, switches SW1b and SW2b are closed, and switches SW3b and SW4b are opened. This causes capacitor $C_s$b to be charged to the voltage $V_{reset}-V_{ref}$. After $C_s$b has been charged up, SW1b and SW2b open (disconnect) to complete the sampling. To sample the data signal, a similar operation is performed. That is, switches SW1a and SW2a are closed, and switches SW3a and SW4a are opened. This causes capacitor $C_s$a to be charged to the voltage $V_{data}-V_{ref}$. After $C_s$a has been charged up, the switches SW1a and SW2a are opened.

In order to convert the difference between the reset to the data signal into current, SW3b, SW5b, SW3a and SW4a turn on. As a result the sampled reset voltage will appear on the right side of the resistor and the sampled data voltage will be on the left side of the resistor R.

Because the voltages appearing on the left and right sides of resistor R are $V_{data}$ and $V_{reset}$, respectively, the current that flows through resistor R is $I_{1n}=(V_{reset}-V_{data})/R$. This current flows to the input of current-mode ADC 502 and is converted to a digital value. In this configuration, any type of current-mode ADC may be used; for example, a sigma-delta ADC may be used to convert the difference signal into a digital value with a high accuracy.

As can be seen from FIG. 5, the current from current source $I_1$ is split and flows into the two transistors Ta and Tb. The current flowing through transistor Ta is $I_{in}=(V_{reset}-V_{data})/R$, whereas the current at transistor Tb is $I_2=I_1-I_{in}$. To ensure proper operation of dual S/H circuit 500, current source $I_1$ is chosen so that the current value $I_1$ is larger than the maximum possible value of $(V_{reset}-V_{in})$ R for any $V_{reset}$ and $V_{data}$ values.

In dual S/H circuit 500, ADC 502 receives as an input the current $I_{in}=(V_{reset}-V_{data})/R$. This indicates that the CDS subtraction step (that is, subtracting the reset value from the light exposed signal value) is automatically done in the analog domain via the circuit arrangement. This advantageously occurs without any additional circuitry required. Another advantage to the configuration of dual S/H circuit 500 is that ADC 502 receives a scaled version of the signal difference with a scaling factor of 1/R. This is equivalent to a gain in the circuit. Thus, R may be controlled (for example, by using a variable resistor, several resistors that may be selected among, and the like) to achieve various analog gains. Thus, dual S/H circuit 500 has both CDS subtraction and analog gain capabilities built in. The output of ADC 502 is a digital value corresponding to $(V_{reset}-V_{data})/R$, and may include additional gain in the digital domain if desired.

Figure 6:
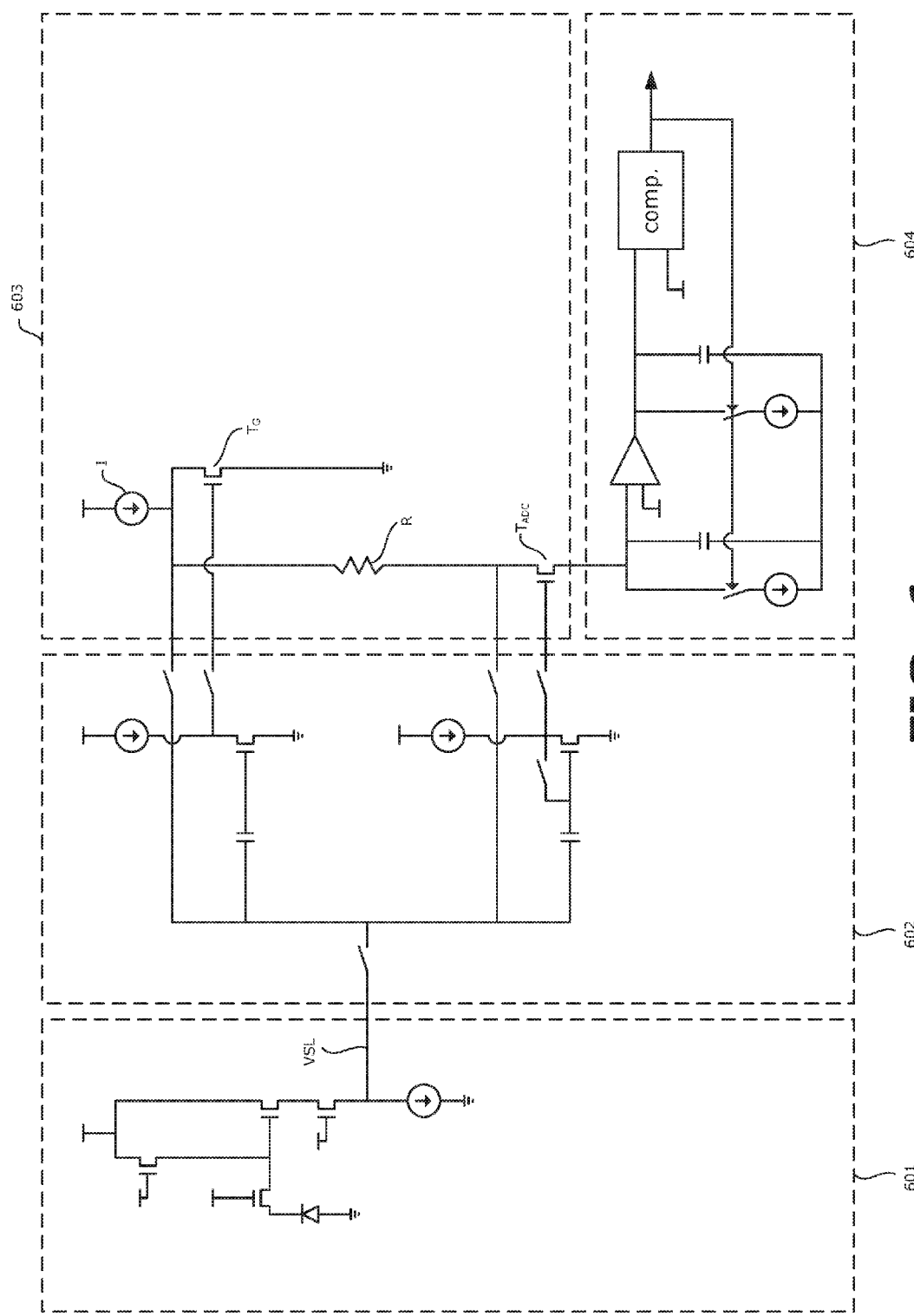
FIG. 6 illustrates an exemplary dual S/H circuit according to various aspects of the present disclosure.

FIG. 6 illustrates an implementation of the circuit block diagram illustrated in FIG. 5. For ease of illustration, FIG. 6 shows only a single pixel 601, although in practical implementations pixel 601 is one of an array of pixels. Pixel 601 outputs a pixel signal via vertical signal line VSL to a pair of transistor S/H circuits 602. The two S/H transistor circuits 602 are controlled by switches so that one S/H circuit samples the reset signal, whereas the other S/H circuit samples the light exposed signal. Outputs from the two S/H circuits 602 are connected to V2I circuit 603. V2I circuit 603 comprises a current source I and a resistor R. Resistor R is connected across the two S/H outputs, and as a result the current in the resistor ($I_R$) is given by the difference between the sampled reset signal and the sampled light exposed signal divided by R. That is, $I_R=(V_{reset}-V_{data})/R$.

As illustrated by FIG. 6, current from current source I is split between resistor R and the source-follower PMOS transistor $T_G$ that connects to ground. Thus, where the current flowing through resistor R is $I_R$, the current flowing through the grounding transistor is $I-I_R$. Therefore, to ensure proper circuit operation, the value of current source I is chosen so that the value I is larger than the maximum possible value of $(V_{reset}-V_{data})$ R for any $V_{reset}$ and $V_{data}$ values. Note that the entire current though the grounding transistor, maintaining a constant current through that node. This reduces pixel value related effects such as streaking.

Current $I_R$ is fed via source-follower PMOS transistor $T_{ADC}$ to ADC 604, which is preferably a current mode sigma-delta ADC. Thus, ADC 604 sees an input current $(V_{reset}-V_{data})/R$. As described above with regard to FIG. 5, both CDS subtraction and analog gain capabilities are therefore built in to this circuit. The output of ADC 604 is a digital value corresponding to $(V_{reset}-V_{data})/R$.

[Parallel Dual Sample-and-Hold Configuration]

Figure 7:
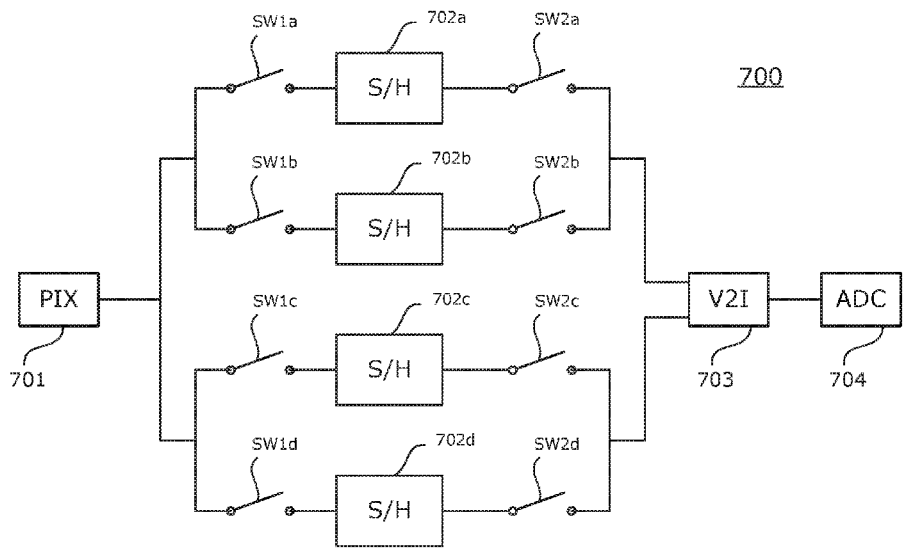
FIG. 7 illustrates an exemplary parallel dual S/H circuit according to various aspects of the present disclosure.

The speed at which the above S/H circuit can operate is affected by the settling time of capacitors, stray capacitances, and the like. If a particular imaging application requires increased throughput capabilities, it is possible to configure a pair of dual S/H circuits to operate in parallel. FIG. 7 illustrates a parallel dual S/H circuit 700 according to an aspect of the present disclosure. Parallel dual S/H circuit 700 includes two sets of dual S/H circuits, totaling four S/H circuits 702a-702d, provided for one ADC 704. Parallel dual S/H circuit 700 further includes switches SW1a, SW1b, SW1c, SW1d, SW2a, SW2b, SW2c, and SW2d which, in combination, provide signals from a pixel unit 701 having pixels arranged in rows and columns to particular ones of the S/H circuits 702a-702d, and subsequently to V2I circuit 703 and ADC 704. V2I circuit 703 may be a circuit including a current source and a resistor, such as is illustrated in FIGS. 5-6.

According to this arrangement, parallel dual S/H circuit 700 is capable of processing two pixels in parallel from two different rows of pixel array 701 in an alternating fashion. In practical image sensors with a column ADC structure, multiple sets of circuit 700 are provided, with one circuit 700 operating on one column of pixels. For parallel operation, the switches may be controlled by providing two control signals WF1 and WF2, with switches SW1b, SW1d, SW2a, and SW2c being provided with control signal WF1 and switches SW1a, SW1c, SW2b, and SW2d being provided with control signal WF2.

Figure 8:
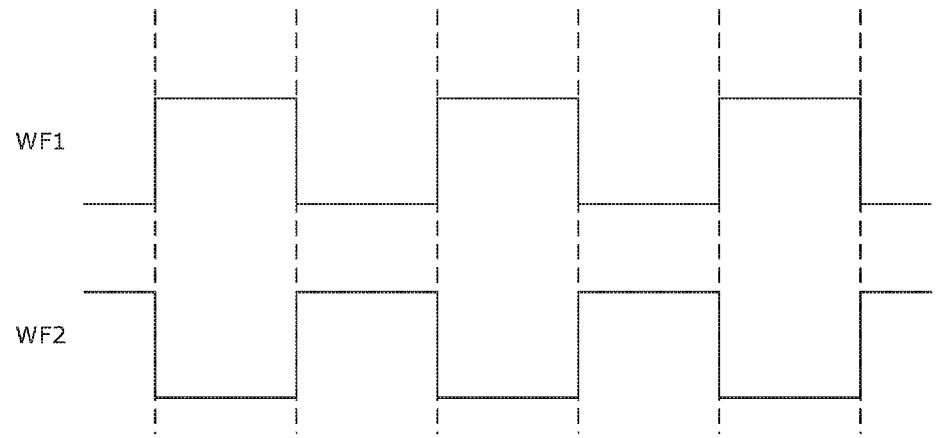
FIG. 8 illustrates an exemplary signal timing diagram of the exemplary parallel dual S/H circuit according to FIG. 7.

FIG. 8 illustrates an exemplary timing diagram for control signals WF1 and WF2. According to this configuration, WF1 provides a signal to close switches during odd clock cycles and open switches during even clock cycles. In contrast, WF2 provides a signal to open switches during odd clock cycles and close switches during even clock cycles. Thus, in FIG. 8, a high level indicates that a switch which receives the waveform is in a closed position, whereas a low level indicates that a switch which receives the waveform is in an open position.

At a first clock, switches that receive control signal WF1 are closed and switches that receive control signal WF2 are opened. During this clock, the reset and light exposed values of the pixels are sampled by S/H circuits 702b and 702d, respectively. At the next clock, switches that receive control signal WF1 are opened and switches that receive control signal WF2 are closed. During this clock, $V_{reset}$ and $V_{data}$ for pixels in the first row of the image are transferred to V2I circuit 703, which results in currents proportional to $V_{data}-V_{reset}$ being provided to ADC 704 for conversion to digital form. Within this same clock, the reset and light exposed values of pixels in the second row of the image are sampled by S/H circuits 702a and 702c, respectively.

During the third clock, the states of the switches are again flipped. Hence, switches that receive control signal WF1 are closed and switches that receive control signal WF2 are opened. During this clock, the sampled signals from the second row of the image are converted by V2I circuit 703 and ADC 704 to provide a digital output proportional to $V_{data}-V_{reset}$ for the second row of the image. During this same clock, the reset and light exposed values of pixels in the third row of the image are sampled by S/H circuits 702b and 702d, respectively. This alternating procedure repeats until all rows of pixels in the image have been processed.

Using the configuration illustrated in FIGS. 7-8, the pixels in an image are processed by circuit 700 for two rows in parallel, where one row of pixels are sampled while sampled values representing the previous row of pixels are concurrently converted into digital form. As a result, a 2X improvement in speed is achieved.

Although two sets of dual S/H circuits are used in FIG. 7 for one column of pixels, a common V2I circuit 703 is used. Because of variations in the circuit parameters of the ADC 704 and random variations in the resistor value R in V2I circuit 703, mismatches in the two sets will result in both gain and offset errors (i.e. noise). For this purpose, gain and offset corrections can be performed in a straightforward manner, for example by calibrating and correcting.

ADC 704 may be any type of analog-to-digital converter. For example, ADC 704 may be a single slope ADC, a flash ADC, a sigma-delta ADC, a successive approximation ADC, and the like. It is preferable to use a sigma-delta ADC for ADC 704, because a sigma-delta ADC operates using oversampling where each conversion is the result of many high speed samples. The output from a sigma-delta ADC may be passed through a decimation filter to generate the final digital output. As a result, ADC 704 will have an inherent low-pass filtering characteristic which helps reduce the sampling amplifiers and resistor noise.

CONCLUSION

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An image processing circuit, comprising:
   a voltage-to-current circuit including a resistor and a current source, and configured to receive a first data corresponding to a pixel and a second data corresponding to the pixel and output a difference data; and
   a current-mode analog-to-digital converter configured to convert the difference data from an analog form to a digital form.

2. The image processing circuit according to claim 1, wherein the resistor and the current source are connected in series.

3. The image processing circuit according to claim 1, further comprising:
   a first sample-and-hold circuit configured to sample the first data and supply the sampled first data to a first end of the resistor; and
   a second sample-and-hold circuit configured to sample the second data and supply the sampled second data to a second end of the resistor.

4. The image processing circuit according to claim 1, wherein the first data corresponds to a data signal of the pixel, and the second data corresponds to a reset signal of the pixel.

5. The image processing circuit according to claim 1, wherein the analog-to-digital converter is a current-mode sigma-delta analog-to-digital converter.

6. The image processing circuit according to claim 1, wherein the resistor has a variable resistance value.

7. An image processing circuit, comprising:
   a voltage-to-current circuit including a resistor and a current source, and configured to receive a first data corresponding to a first pixel and a second data corresponding to the first pixel and output a first difference data, and to receive a third data corresponding to a second pixel and a fourth data corresponding to the second pixel and output a second difference data; and
   an analog-to-digital converter configured to convert the first and second difference data from an analog form to a digital form.

8. The image processing circuit according to claim 7, wherein the resistor and the current source are connected in series.

9. The image processing circuit according to claim 7, further comprising:
   a first dual sample-and-hold circuit configured to sample the first data and supply the sampled first data to a first end of the resistor; and
   a second dual sample-and-hold circuit configured to sample the second data and supply the sampled second data to a second end of the resistor.

10. The image processing circuit according to claim 9, wherein:
    the first dual sample-and-hold circuit includes a first sample-and-hold circuit configured to sample the first data, a second sample-and-hold circuit configured to sample the second data, and a first plurality of switches; and
    the second dual sample-and-hold circuit includes a third sample-and-hold circuit configured to sample the third data, a fourth sample-and-hold circuit configured to sample the fourth data, and a second plurality of switches.

11. The image processing circuit according to claim 7, wherein the analog-to-digital converter is a current-mode sigma-delta analog-to-digital converter.

12. The image processing circuit according to claim 7, wherein the resistor has a variable resistance value.

13. The image processing circuit according to claim 7, wherein the first data corresponds to a data signal of the first pixel, the second data corresponds to a reset signal of the first pixel, the third data corresponds to a data signal of the second pixel, and the fourth data corresponds to a reset signal of the second pixel.

14. The image processing circuit according to claim 7, wherein:

the first pixel is in a first row of a pixel array; and
the second pixel is in a second row of the pixel array.

15. An imaging device, comprising:
a pixel array including a first pixel and a second pixel; and
an image processing circuit, including:
   a voltage-to-current circuit including a resistor and a current source, and configured to receive a first data corresponding to the first pixel and a second data corresponding to the first pixel and output a first difference data, and to receive a third data corresponding to the second pixel and a fourth data corresponding to the second pixel and output a second difference data; and
   an analog-to-digital converter configured to convert the first and second difference data from an analog form to a digital form.

16. The imaging device according to claim 15, wherein the resistor and the current source are connected in series.

17. The imaging device according to claim 15, further comprising:
a first dual sample-and-hold circuit configured to sample the first data and supply the sampled first data to a first end of the resistor; and
a second dual sample-and-hold circuit configured to sample the second data and supply the sampled second data to a second end of the resistor.

18. The imaging device according to claim 17, wherein:
the first dual sample-and-hold circuit includes a first sample-and-hold circuit configured to sample the first data, a second sample-and-hold circuit configured to sample the second data, and a first plurality of switches; and
the second dual sample-and-hold circuit includes a third sample-and-hold circuit configured to sample the third data, a fourth sample-and-hold circuit configured to sample the fourth data, and a second plurality of switches.

19. The imaging device according to claim 15, wherein the first data corresponds to a data signal of the first pixel, the second data corresponds to a reset signal of the first pixel, the third data corresponds to a data signal of the second pixel, and the fourth data corresponds to a reset signal of the second pixel.

20. The imaging device according to claim 15, wherein:
the first pixel is in a first row of a pixel array; and
the second pixel is in a second row of the pixel array.

21. The imaging device according to claim 15, wherein:
the analog-to-digital converter is a current-mode sigma-delta analog-to-digital converter.

* * * * *